(12) United States Patent
Kim et al.

(10) Patent No.: US 8,368,097 B2
(45) Date of Patent: Feb. 5, 2013

(54) LIGHT EMITTING DIODE PACKAGE AND METHOD OF MANUFACTURING THE SAME

(75) Inventors: Hyun Jun Kim, Suwon (KR); Chang Hwan Choi, Seongnam (KR); Jong Myeon Lee, Gwacheon (KR); Dong Woohn Kim, Suwon (KR); Won Ha Moon, Suwon (KR)

(73) Assignee: Samsung Electronics Co., Ltd., Gyunggi-Do (KR)

( * ) Notice: Subject to any disclaimer, the term of this patent is extended or adjusted under 35 U.S.C. 154(b) by 205 days.

(21) Appl. No.: 11/826,248

(22) Filed: Jul. 13, 2007

(65) Prior Publication Data

US 2008/0142822 A1 Jun. 19, 2008

(30) Foreign Application Priority Data

Dec. 13, 2006 (KR) .................. 10-2006-0127324

(51) Int. Cl.
*H01L 33/00* (2010.01)

(52) U.S. Cl. ........... 257/98; 257/E33.059; 257/E33.073; 438/27; 438/32

(58) Field of Classification Search .................... 257/98, 257/E33.059, E33.073; 438/27, 32
See application file for complete search history.

(56) References Cited

U.S. PATENT DOCUMENTS

| 5,742,438 | A  | * | 4/1998  | Conner et al. ................ 359/743 |
| 6,670,207 | B1 | * | 12/2003 | Roberts ........................... 438/27 |
| 7,182,481 | B2 | * | 2/2007  | Shimura ........................ 362/244 |
| 7,256,428 | B2 |   | 8/2007  | Braune et al. |
| 7,355,560 | B2 | * | 4/2008  | Nagai ........................ 343/911 R |
| 2003/0016539 | A1 | * | 1/2003 | Minano et al. ................ 362/347 |
| 2005/0001228 | A1 | * | 1/2005 | Braune et al. .................... 257/99 |
| 2008/0123049 | A1 | * | 5/2008 | Volk .............................. 351/169 |

FOREIGN PATENT DOCUMENTS

| EP | 1 427 029 A2 | 6/2004 |
| JP | 57-183763 U | 5/1981 |
| JP | 63-47302 U | 3/1988 |
| JP | 05-102528 A | 4/1993 |
| JP | 2003-209293 | 7/2003 |
| JP | 2004-532533 | 10/2004 |
| JP | 2006-506803 | 2/2006 |
| JP | 2006-278675 A | 10/2006 |
| JP | 2006-286701 | 10/2006 |
| KR | 10-2004-0087950 | 10/2004 |
| KR | 10-2006-0029110 | 4/2006 |
| KR | 10-2006-55934 | 5/2006 |
| WO | WO 2004/044995 A1 | 5/2004 |

OTHER PUBLICATIONS

Yasuo, English translation of JP 2006-286701, published Oct. 19, 2006.*

(Continued)

*Primary Examiner* — John C Ingham
(74) *Attorney, Agent, or Firm* — McDermott Will & Emery LLP

(57) ABSTRACT

An LED package comprises a frame having a concave portion formed in the center thereof; one or more LED chips mounted on the bottom surface of the concave portion; and a lens filled in the concave portion, the lens having an upper surface formed of continuous prismatic irregularities forming concentric circles.

4 Claims, 8 Drawing Sheets

OTHER PUBLICATIONS

Japanese Office Action, w/ English translation thereof, issued in Japanese Patent Application No. JP 2007-194344 dated Sep. 28, 2010.

Japanese Office Action, with English translation, issued in Japanese Patent Application No. 2007-194344, mailed Apr. 5, 2011.

Japanese Decision of Rejection, w/ English translation thereof, issued in Japanese Patent Application No. 2007-194344, dated Nov. 1, 2011.

* cited by examiner

US 8,368,097 B2

LIGHT EMITTING DIODE PACKAGE AND METHOD OF MANUFACTURING THE SAME

CROSS-REFERENCE TO RELATED APPLICATIONS

This application claims the benefit of Korean Patent Application No. 10-2006-0127324 filed with the Korea Intellectual Property Office on Dec. 13, 2006, the disclosure of which is incorporated herein by reference.

BACKGROUND OF THE INVENTION

1. Field of the Invention

The present invention relates to a light emitting diode (LED) package, which can be easily manufactured and has an enhanced light extraction rate such that light extraction efficiency can be enhanced, while being reduced in thickness, and a method of manufacturing the same.

2. Description of the Related Art

In general, LEDs generate minority carriers (electrons and holes) injected by using a p-n junction structure of semiconductor and then recombine them to emit light. That is, when a forward voltage is applied to a semiconductor of a specific element, electrons and holes are recombined through migration in a positive-negative junction. Then, energy level is dropped, thereby emitting light.

Since the LEDs can irradiate high-efficiency light using a low voltage, the LEDs can be used in home appliances, remote controls, electric signs, displays, various automated equipments and the like.

In particular, as information communication devices are reduced in size and are slimmed, various parts of the devices such as resistors, condensers, noise filters and the like are further reduced in size. Recently, the LEDs are produced in the form of surface mount devices (SMDs) to be directly mounted on a printed circuit board (PCB). Accordingly, LED lamps used for display devices are being developed into SMDs. The SMDs can replace conventional lamps, and be used as lighting devices of various colors, a character display unit and an image display unit.

As the LEDs are applied to various fields, high brightness is required in various lamps such as a home lamp, an emergency lamp and the like. Currently, as a result, high power LEDs are widely used.

Hereinafter, conventional LED packages will be described with reference to accompanying drawings.

FIG. 1A is a plan view of a conventional LED package having a hemispheric lens mounted thereon, and FIG. 1B is a cross-sectional view of FIG. 1A. FIG. 2 is a perspective view of a conventional LED package having a flat lens mounted thereon. FIG. 3 is a graph comparatively showing light extraction rates of the conventional LED packages.

As shown in FIGS. 1A and 1B, the conventional LED package having a hemispheric lens mounted thereon includes a circular frame 11, a plurality of LED chips 12 mounted on the inner bottom surface of the circular frame 11, a molding material 13 such as silicon or epoxy resin for protecting the LED chips 12, and a hemispheric lens 14 mounted on the circular frame 11.

In such an encapsulation-type LED package, the hemispheric lens 14 serves as a buffer, which reduces a difference in refractive index between the LED chips 12 having a high refractive index and the air, such that light extraction from the LED chips 12 can be significantly enhanced. When it can be assumed that an LED chip is an approximate point light source, the hemispheric lens 14 guarantees the vertical incidence of light at the interface between the lens 14 and the external air such that reflection can be minimized. Therefore, such a hemispheric lens may be the most ideal structure for light extraction.

However, high-power and high-brightness LED packages used as backlight units (BLU) of middle-sized or large-sized LCDs or flashes of cameras adopt a large-area chip or a multi-chip structure where a plurality of existing LED chips are used. Therefore, the size of a light source increases. Accordingly, when a hemispheric lens has a considerably large diameter, a large-area chip or a multi-chip structure can be assumed as a point light source.

Therefore, such LED packages are not suitable for lighting devices, cameras, or mobile phones which require an ultra-slim structure.

In this case, a LED package using a flat lens 24 shown in FIG. 2, instead of the hemispheric lens, is applied. However, when the flat lens 24 is used, the light extraction rate of the LED package is considerably reduced, compared with when the hemispheric lens is used.

That is, as shown in FIG. 3, when the light extraction rates of an LED package having no lens, the LED package having a flat lens mounted thereon, and the LED package having a hemispheric lens in accordance with a distance from the center of each package to the LED chips are compared, a distance where the light extraction rates of the respective packages are the largest is about 0.84 mm. At this distance, the light extraction rate of the package having no lens is about 25%, the light extraction rate of the package having a flat lens is about 35%, and the light extraction rate of the package having a hemispheric lens is about 53%.

As described above, the package having a hemispheric lens has the largest light extraction rate. However, the height of the LED package inevitably increases as much as the diameter of the hemispheric lens, which means that the package having a hemispheric lens is not suitable for flashes of mobiles phones and the like. When the LED package having a flat lens is used, the size of the LED package is reduced, but a light extraction rate thereof decreases.

SUMMARY OF THE INVENTION

An advantage of the present invention is that it provides an LED package of which the structure is improved so that the LED package can be easily manufactured. Further, a light extraction rate of the LED package is enhanced so that light extraction efficiency can be enhanced, while the LED package can be reduced in thickness.

Another advantage of the invention is that it provides a method of manufacturing an LED package.

Additional aspect and advantages of the present general inventive concept will be set forth in part in the description which follows and, in part, will be obvious from the description, or may be learned by practice of the general inventive concept.

According to an aspect of the invention, an LED package comprises a frame having a concave portion formed in the center thereof; one or more LED chips mounted on the bottom surface of the concave portion; and a lens filled in the concave portion, the lens having an upper surface formed of continuous prismatic irregularities forming concentric circles.

Preferably, the side of the concave portion is formed in a tapered shape expanding upward.

Preferably, the frame has an upper opening formed in a circular shape, and the lower circumference of the lens is formed in a shape corresponding to the shape of the upper opening of the frame.

Preferably, the lens is formed of a transparent resin material.

Preferably, the prismatic irregularities form concentric circles from the center of the upper surface of the lens toward the edge.

Preferably, the concentric circles are spaced in even intervals.

According to another aspect of the invention, an LED package comprises a frame having a concave portion formed in the center thereof; one or more LED chips mounted on the bottom surface of the concave portion; and a lens filled in the concave portion, the lens having an upper surface formed of a Fresnel lens surface.

Preferably, the side of the concave portion is formed in a tapered shape expanding upward.

Preferably, the frame has an upper opening formed in a circular shape, and the lower circumference of the lens is formed in a shape corresponding to the shape of the upper opening of the frame.

Preferably, the lens is formed of a transparent resin material.

According to a further aspect of the invention, an LED package comprises a frame having a concave portion formed in the center thereof; one or more LED chips mounted on the bottom surface of the concave portion; and a flat dome lens filled in the concave portion.

Preferably, the side of the concave portion is formed in a tapered shape expanding upward.

Preferably, the frame has an upper opening formed in a circular shape, and the lower circumference of the lens is formed in a shape corresponding to the shape of the upper opening of the frame.

Preferably, the lens is formed of a transparent resin material.

According to a still further aspect of the invention, a method of manufacturing an LED package comprises preparing one or more LED chips on a concave portion of a frame; dispensing resin into the concave portion; imprinting a stamp on the upper surface of the resin such that the stamp is carved; and separating the stamp.

Preferably, the method further comprises solidifying the resin in a state where the stamp is carved. The solidifying of the resin is performed after the imprinting of the stamp.

Preferably, a release agent for promoting separation is provided between the resin and the stamp.

The stamp may have concentrically continuous prismatic irregularities engraved on the bottom surface thereof.

The stamp may have a Fresnel lens surface engraved on the bottom surface thereof.

The stamp may have the shape of a flat dome lens engraved on the bottom surface thereof.

Preferably, the resin is epoxy-, rubber-, or silicon-based transparent resin.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
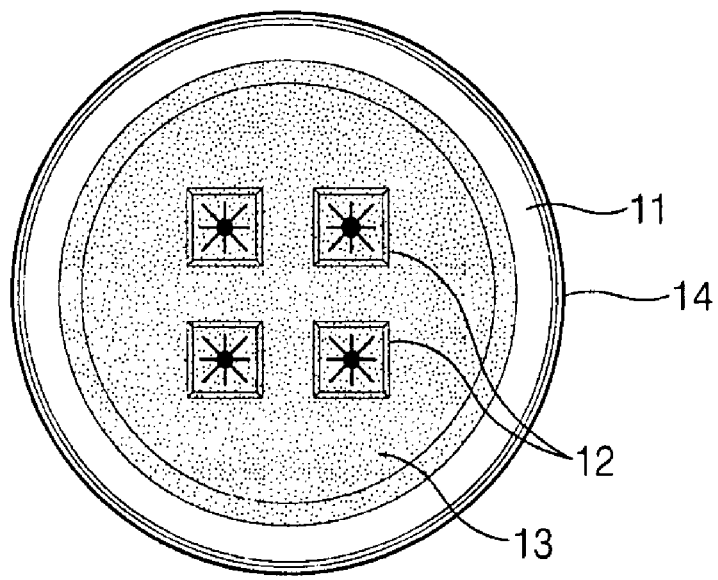
FIG. 1A is a plan view of a conventional LED package having a hemispheric lens mounted thereon.
Figure 1B:
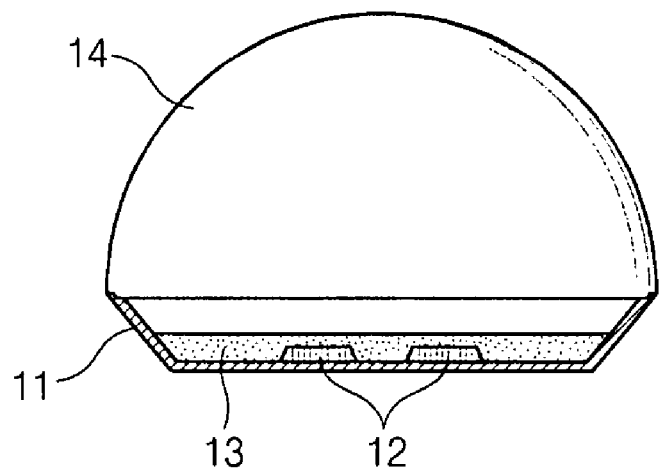
FIG. 1B is a cross-sectional view of FIG. 1A.
Figure 2:
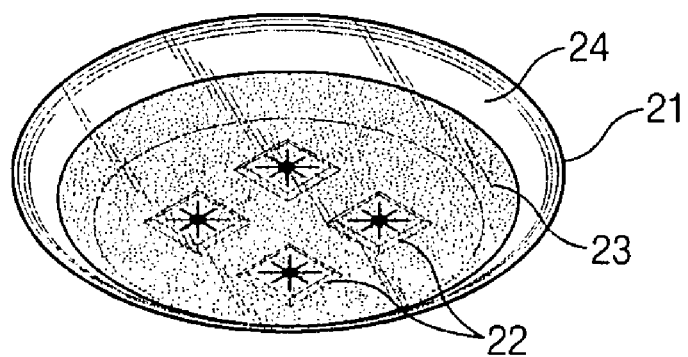
FIG. 2 is a perspective view of a conventional LED package having a flat lens mounted thereon
Figure 3:
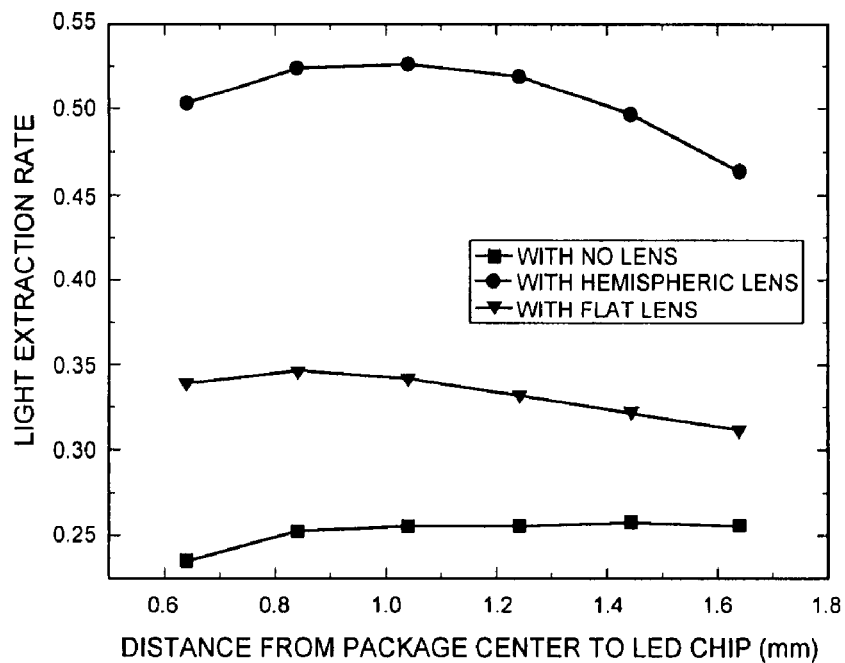
FIG. 3 is a graph comparatively showing light extraction rates of the conventional LED packages.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, preferred embodiments of the present invention will be described in detail with reference to the accompanying drawings.

To explain a basic principle of the invention, a light extraction structure of a hemispheric lens and a light extraction structure of a conical lens will be first described with reference to FIGS. 4A and 4B.

Figure 4A:
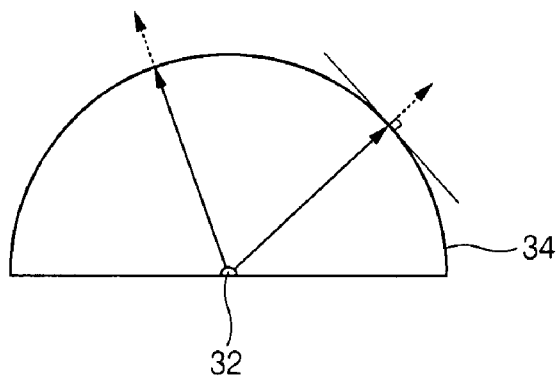
FIG. 4A is a diagram showing the structure of a hemispheric lens for explaining the principle of the invention.
Figure 4B:
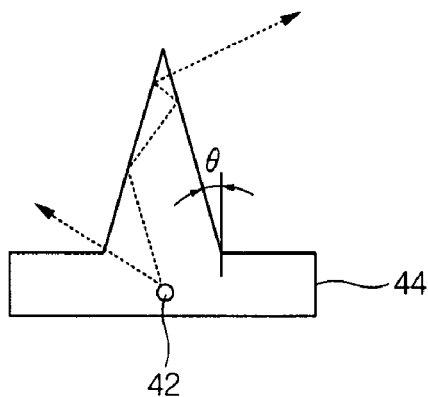
FIG. 4B is a diagram showing the structure of a conical lens for explaining the principle of the invention.

FIG. 4A is a diagram showing the structure of a hemispheric lens for explaining the principle of the invention, and FIG. 4B is a diagram showing the structure of a conical lens for explaining the principle of the invention.

As shown in FIG. 4A, when a hemispheric lens 34 is mounted, it is the most ideal for light extraction of a LED package.

This is because, when it is assumed that a point light source 32 is located in the lower center of the hemispheric lens 34, vertical incidence of light is guaranteed at the interface between the outer surface of the hemispheric lens 34 and the external air such that total reflection does not occur.

Further, as shown in FIG. 4B, a conical lens 44 is also ideal for light extraction of a LED package, in addition to the hemispheric lens 34.

In the conical lens 44, when light emitted from the base of a conical portion or a lower point light source 42 is incident on the interface between the conical portion and the external air, the light is transmitted or induced toward an upper portion of the conical portion through multiple reflections.

The light emitted from the point light source 42 is nearly vertically incident, because the incident angle with the interface between the conical portion and the external air gradually decreases through the multiple reflections. Then, the light is emitted to the outside of the conical portion.

Unlike the hemispheric lens 34, the conical lens 44 can induce most of light, emitted from the lower portion thereof, to the upper portion thereof through the conical portion. Therefore, the conical lens 44 is not influenced by the position of the lower light source.

In the invention, the above-described two structures, that is, the hemispheric lens and the conical lens are applied in a flat shape. In the conical lens, a lattice structure composed of a plurality of small cones can be applied. In this case, it can be expected that a light extraction effect is slightly reduced due to an interference effect between adjacent cones. However, when a circular reflecting frame serving as a structure for minimizing the interference effect is included, the conical lens can be implemented into a prism lattice structure forming concentric circles shown in FIGS. 5 and 6.

Meanwhile, to implement a flat lens structure for making the hemispheric lens thin, a Fresnel lens structure and a flat dome lens structure can be considered. The flat dome lens structure uses an angle division technique which is newly applied in the invention.

Figure 4C:
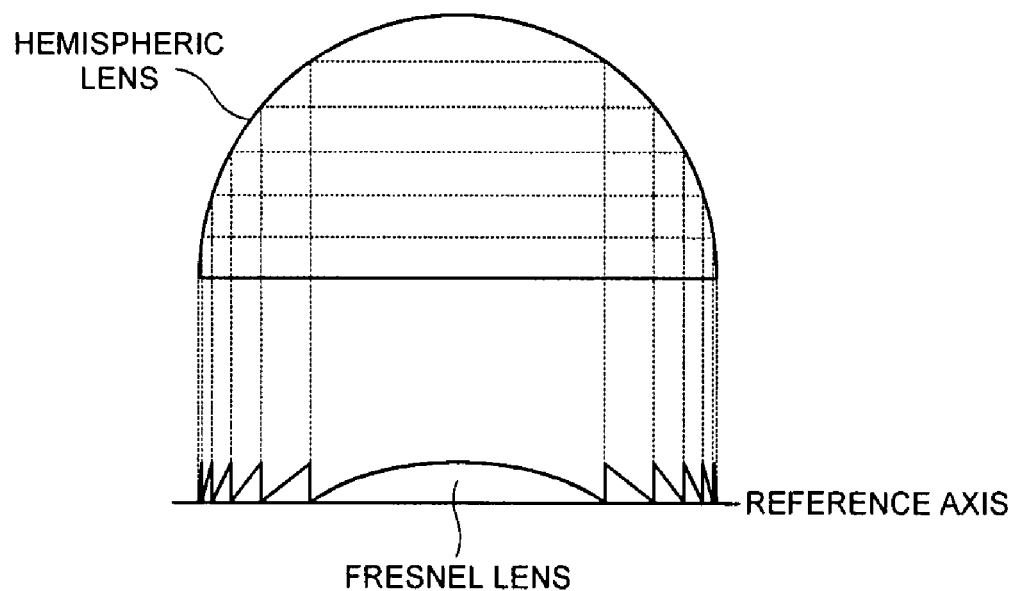
FIG. 4C is a diagram showing the structure of a Fresnel lens for explaining the principle of the invention.

First, a case where the Fresnel lens structure is applied will be described. Since light is diffracted on the surface of a convex lens, unnecessary portions inside the convex lens except for portions including the surface of the convex lens are cut out in a stair shape, and the portions including the surface of the convex lens are connected on the basis of a reference axis, as shown in FIG. 4C. Then, the lens composed of the portions has the same function as a general convex lens. In this case, light extraction efficiency in such a lens is slightly reduced, compared with the hemispheric lens or the concentric prism lattice structure.

Figure 4D:
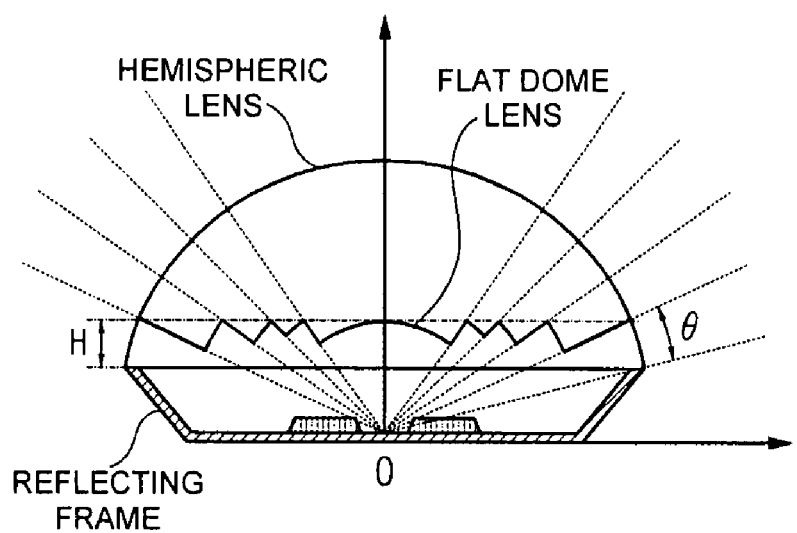
FIG. 4D is a diagram showing the structure of a flat dome lens, in which an angle division technique is applied, for explaining the principle of the invention.
Figure 4E:
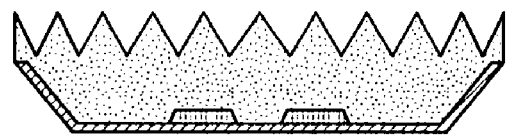
FIG. 4E is a cross-sectional view of LED packages in which the principle of the invention is applied.
Figure 4E:
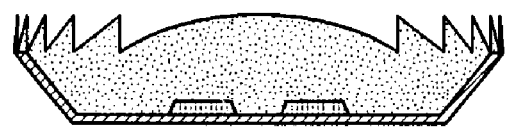
Figure 4E:
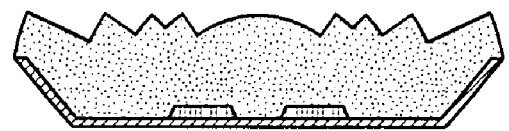

Next, the flat dome lens structure using an angle division technique will be described. As shown in FIG. 4D, a hemispheric lens is divided in a suitable number of predetermined angles θ from a line connecting one end of a reflecting frame and the center of an ideal dome lens where it is assumed that a point light source O is located in the center of the lens. In FIG. 4D, the number of angles is four in the left side. In this case, the first divided angle determines the height H of a flat lens which is to be implemented. Then, partial dome lenses having a new diameter, which is a length of the angle dividing line from the center to a point meeting a straight line indicating the height H, are formed. Further, in the central portion, a lens is formed in a circle tangent to the straight line indicating the height H such that a flat dome lens is formed as a whole.

Such a flat dome lens has the same principle as an ideal hemispheric lens and thus has an advantage that most of characteristics such as light extraction efficiency and the like are the same as those of the hemispheric lens.

First Embodiment of LED Package

Figure 5:
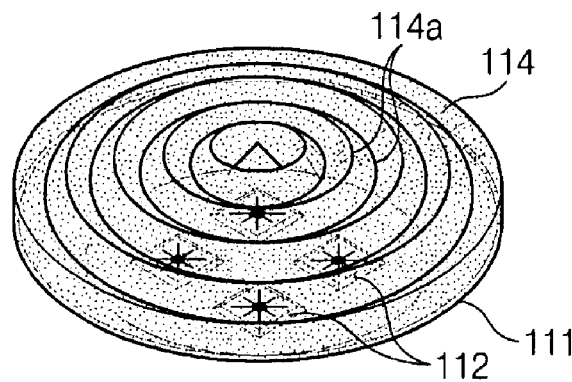
FIG. 5 is a perspective view of an LED package according to a first embodiment of the invention.
Figure 6:
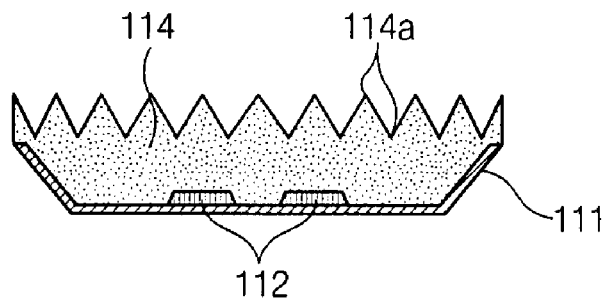
FIG. 6 is a cross-sectional view of FIG. 5.

Referring to FIGS. 5 and 6, an LED package according to a first embodiment of the invention will be described.

FIG. 5 is a perspective view of an LED package according to a first embodiment of the invention, and FIG. 6 is a cross-sectional view of FIG. 5.

As shown in FIGS. 5 and 6, the LED package according to the first embodiment of the invention includes a frame 111 having a concave portion formed in the center thereof, one or more LED chips 112 mounted on the bottom surface of the concave portion, and a lens 114 filled in the concave portion and having an upper surface formed of continuous prismatic irregularities 114 forming concentric circles.

Preferably, the side of the concave portion is formed in a tapered shape expanding upward.

The side shape of the concave portion and the inclined angle of the tapered shape are properly set in accordance with the specification of an LED package. However, like a flash light source of a camera, it is preferable that the side shape is formed in a circular shape, seen from the top, to irradiate light to a predetermined distance without a spot and the inclined angle is set to range from 40 to 80 degrees.

The side surface of the concave portion serves as a reflecting surface for concentrating light emitted from the LED chip 112 to a desirable direction. Preferably, the side surface of the concave portion is nickel-plated or silver-color-plated.

Preferably, the upper opening of the frame 111, that is, the upper end of the concave portion is formed in a circular shape, and the lower circumference of the lens 114 is formed in a shape corresponding to the shape of the upper end of the concave portion.

The lens 114 is formed of a transparent resin material, and the prismatic irregularities 114a formed on the upper surface of the lens 114 form concentric circles from the center of the upper surface toward the edge. Preferably, the concentric circles formed by the prismatic irregularities 114a are spaced at even intervals.

Method of Manufacturing LED Package According to First Embodiment

Figure 7:
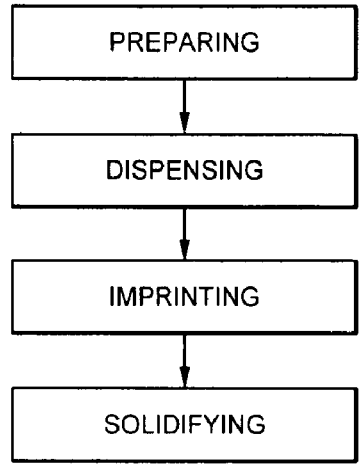
FIG. 7 is a diagram showing a method of manufacturing an LED package according to the first embodiment of the invention.
Figure 8A:
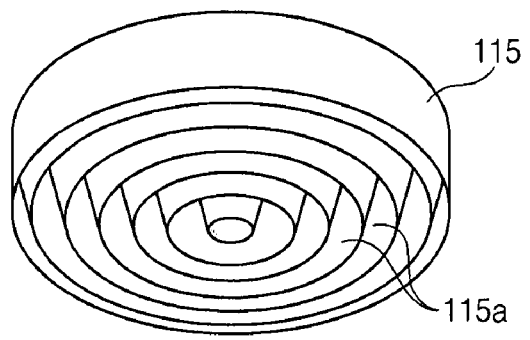
FIGS. 8A and 8B are diagrams for explaining the method of manufacturing an LED package according to the first embodiment of the invention.
Figure 8A:
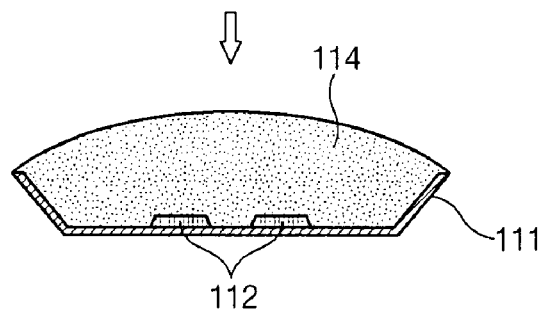
Figure 8B:
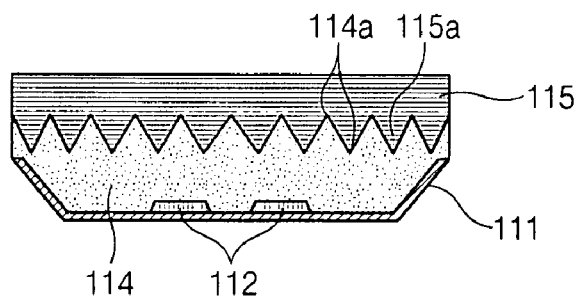

Referring to FIGS. 7 to 8B, a method of manufacturing an LED package according to the first embodiment of the invention will be described.

FIG. 7 is a diagram showing a method of manufacturing an LED package according to the first embodiment of the invention. FIGS. 8A and 8B are diagrams for explaining the method of manufacturing an LED package according to the first embodiment of the invention.

As shown in FIG. 7, the method of manufacturing an LED package according to the first embodiment includes a preparing step, a dispensing step, an imprinting step, a solidifying step, and a separating step.

The preparing step is where one or more LED chips 112 are mounted in the concave portion of the frame 111. The dispensing step is where resin 114 is dispensed into the concave portion. The imprinting step is where a stamp 115 is imprinted on the upper surface of the resin 114 dispensed into the concave portion so as to carve the stamp, as shown in FIG. 8A. The solidifying step is where the resin 114 is solidified in a state where the stamp 115 is carved, as shown in FIG. 8B. The separating step is where the stamp 115 is separated to thereby complete the manufacturing of the LED package.

Preferably, a release agent for promoting separation is provided between the resin 114 and the stamp 115.

That is, the release agent, which contains oil such that the stamp 115 is easily separated from the resin 114, is added into the resin 114 or applied on the engraved portion of the stamp 115.

The stamp 115 has a bottom surface where continuous prismatic irregularities 115a are engraved. The engraved prismatic irregularities 115a forms concentric circles spaced at even intervals from the center toward the edge.

Therefore, when the stamp 115 having the prismatic irregularities 115a engraved thereon is imprinted on the resin 114, continuous prismatic irregularities 114a forming concentric circles are formed on the resin 114.

The resin 114 may be formed of a transparent material such as epoxy, rubber, or silicon-based resin such that light can be transmitted.

Second Embodiment of LED Package

Figure 9:
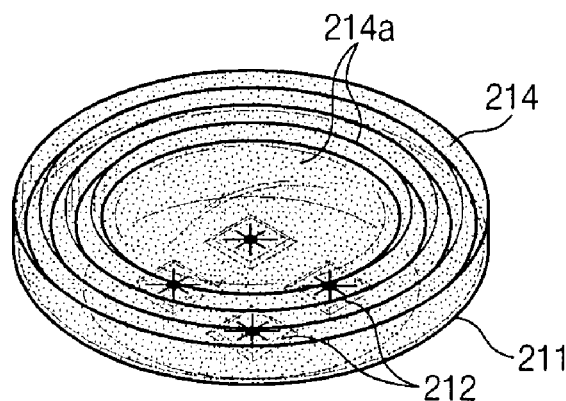
FIG. 9 is a perspective view of an LED package according to a second embodiment of the invention.
Figure 10:
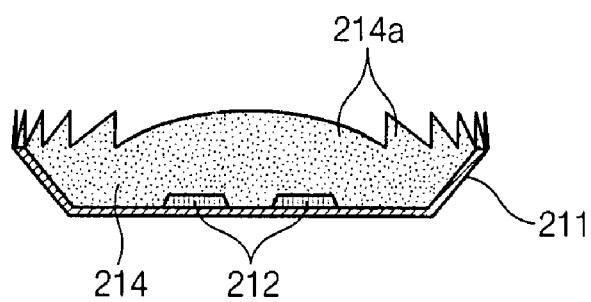
FIG. 10 is a cross-sectional view of FIG. 9.

Referring to FIGS. 9 and 10, an LED package according to a second embodiment of the invention will be described.

As shown in FIGS. 9 and 10, the LED package according to the second embodiment of the invention includes a frame 211 having a concave portion formed in the center thereof, one or more LED chips 212 mounted on the bottom surface of the concave portion, and a lens 214 filled in the concave portion, the lens 214 having an upper surface formed of a Fresnel lens surface 214a.

That is, the LED package according to the second embodiment of the invention has a Fresnel lens surface 214a formed thereon, instead of the continuous prismatic irregularities 114a forming concentric circles.

The Fresnel lens surface 214a can serve as a convex lens while the thickness thereof is reduced. Therefore, although the lens 214 has a small thickness like an existing flat lens, the lens 214 has a much more excellent light extraction rate than the flat lens.

Preferably, the side of the concave portion is formed in a tapered shape expanding upward.

The side shape of the concave portion and the inclined angle of the tapered shape are properly set in accordance with the specification of an LED package. However, like a flash light source of a camera, it is preferable that the side shape is formed in a circular shape, seen from the top, to irradiate light to a predetermined distance without a spot and the inclined angle is set to range from 40 to 80 degrees.

The side surface of the concave portion serves as a reflecting surface for concentrating light emitted from the LED chip 212 to a desirable direction. Preferably, the side surface of the concave portion is nickel-plated or silver-color-plated.

Preferably, the upper opening of the frame 211, that is, the upper end of the concave portion is formed in a circular shape, and the lower circumference of the lens 214 is formed in a shape corresponding to the shape of the upper end of the concave portion.

Method of Manufacturing LED Package According to Second Embodiment

Figure 11A:
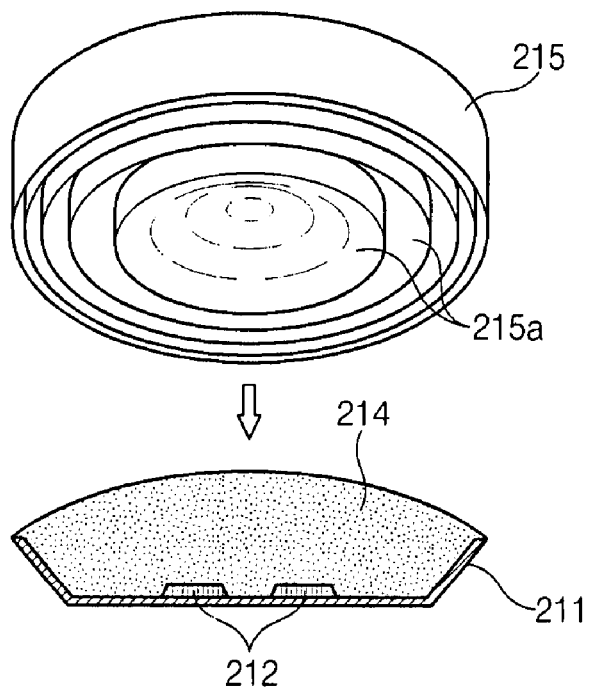
FIGS. 11A and 11B are diagrams for explaining a method of manufacturing an LED package according to the second embodiment of the invention.
Figure 11B:
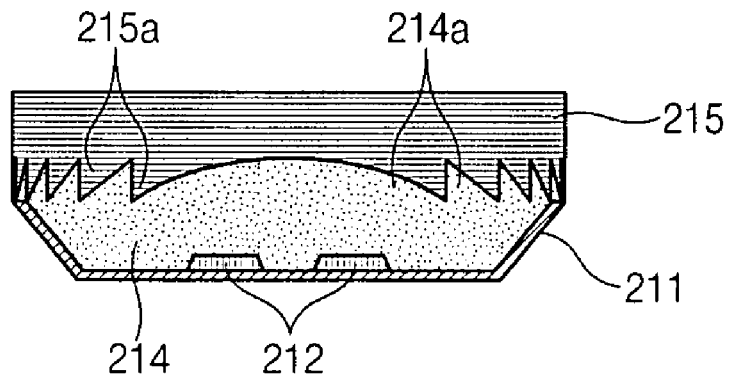

Referring to FIGS. 7, 11A, and 11B, a method of manufacturing an LED package according to the second embodiment of the invention will be described.

FIGS. 11A and 11B are diagrams for explaining a method of manufacturing an LED package according to the second embodiment of the invention.

As shown in FIG. 7, the method of manufacturing an LED package according to the second embodiment includes a preparing step, a dispensing step, an imprinting step, a solidifying step, and a separating step.

The preparing step is where one or more LED chips 212 are mounted in the concave portion of the frame 211. The dispensing step is where resin 214 is dispensed into the concave portion. The imprinting step is where a stamp 215 is imprinted on the upper surface of the resin 214 dispensed into the concave portion so as to carve the stamp, as shown in FIG. 11A. The solidifying step is where the resin 214 is solidified in a state where the stamp 215 is carved, as shown in FIG. 11B. The separating step is where the stamp 215 is separated to thereby complete the manufacturing of the LED package.

In the method of manufacturing an LED package according to the second embodiment of the invention, the Fresnel lens surface 215a is engraved on the bottom surface of the stamp 25, instead of continuous prismatic irregularities forming concentric circles.

Therefore, when the stamp 215 having the Fresnel lens surface 215a engraved thereon is imprinted on the resin 214, the resin 214 has the Fresnel lens surface 215a formed on the upper surface thereof.

Preferably, a release agent for promoting separation is provided between the resin 214 and the stamp 215.

That is, the release agent, which contains oil such that the stamp 215 is easily separated from the resin 214, is added into the resin 214 or applied on the engraved portion of the stamp 215.

The resin 214 may be formed of a transparent material such as epoxy, rubber, or silicon-based resin such that light can be transmitted.

Third Embodiment of LED Package

Figure 12:
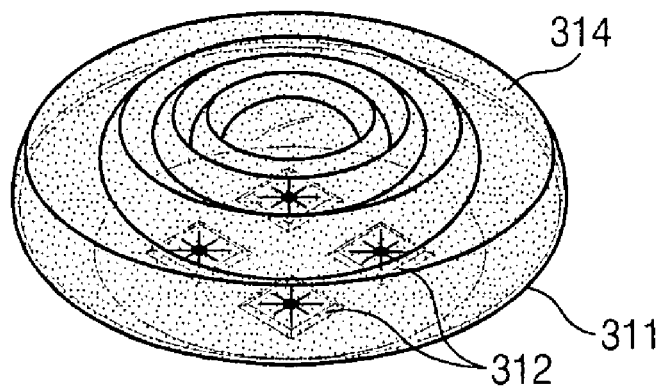
FIG. 12 is perspective view of an LED package according to a third embodiment of the invention.
Figure 13:
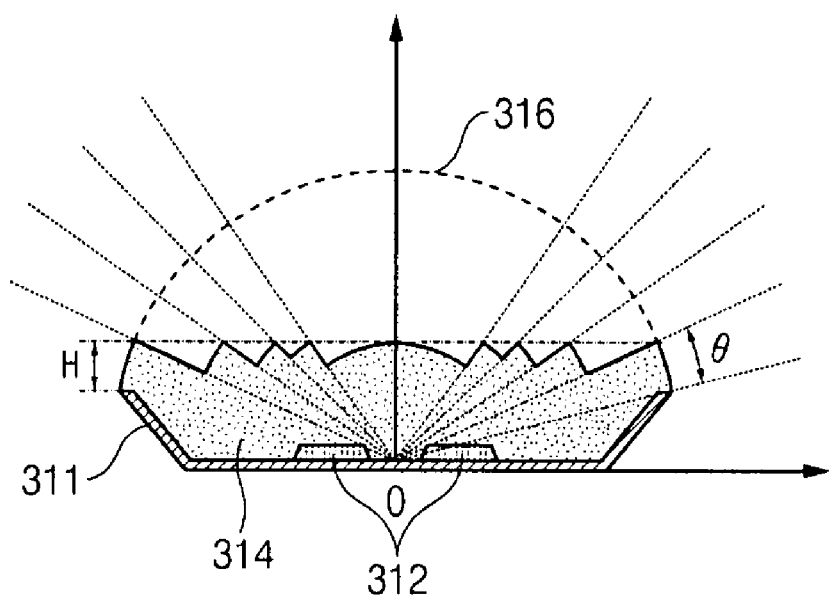
FIG. 13 is a cross-sectional view of FIG. 12.

Referring to FIGS. 12 and 13, an LED package according to a third embodiment of the invention will be described.

As shown in FIGS. 12 and 13, the LED package according to the third embodiment of the invention includes a frame 311 having a concave portion in the center thereof, one or more LED chips 312 mounted on the bottom surface of the concave portion, and a flat dome lens 314 filled in the concave portion.

That is, the LED package according to the third embodiment of the invention has a flat dome lens according to the angle division technique which is newly tried in the invention.

More specifically, the flat dome lens 314 is formed as follows. Referring to FIG. 4D, a hemispheric lens is divided into a suitable number of predetermined angles θ from a line connecting one end of the reflecting frame 311 and the center of the hemispheric lens 316 where it is assumed that a point light source O is located in the center of the lens. In FIG. 4D, the number of angles is four in the left side.

In this case, the first divided angle determines the height H of the flat dome lens 314 which is to be implemented. Partial domes lenses having a new diameter, which is a length of the angle dividing line from the center to a point meeting a straight line indicating the height H, are formed. In the central portion, a lens is formed in a circle tangent to the straight line. As a whole, the flat dome lens 314 is formed.

Since the flat dome lens 314 has the same principle as an ideal hemispheric lens 316, the flat dome lens 314 has an advantage that most characteristics thereof such as light extraction efficiency and the like are the same as those of the hemispheric lens.

Preferably, the side of the concave portion is formed in a tapered shape expanding upward.

The side shape of the concave portion and the inclined angle of the tapered shape are properly set in accordance with the specification of an LED package. However, like a flash light source of a camera, it is preferable that the side shape is formed in a circular shape, seen from the top, to irradiate light to a predetermined distance without a spot and the inclined angle is set to range from 40 to 80 degrees.

The side surface of the concave portion serves as a reflecting surface for concentrating light emitted from the LED chip 312 to a desirable direction. Preferably, the side surface of the concave portion is nickel-plated or silver-color-plated.

Preferably, the upper opening of the frame 311, that is, the upper end of the concave portion is formed in a circular shape, and the lower circumference of the flat dome lens 314 is formed in a shape corresponding to the shape of the upper end of the concave portion.

Method of Manufacturing LED Package According to Third Embodiment

Figure 14A:
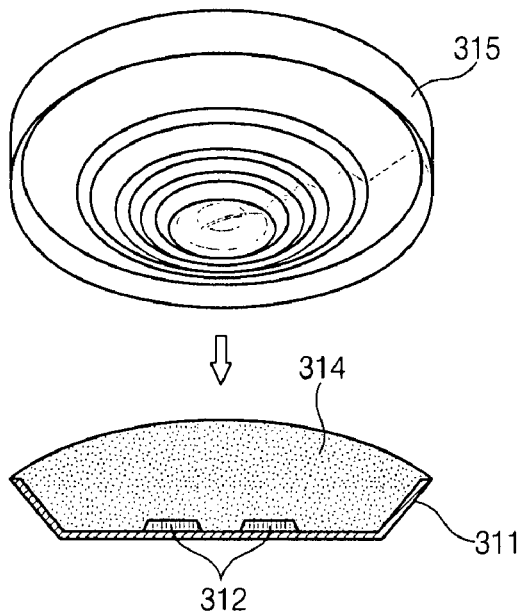
FIGS. 14A and 14B are diagrams for explaining a method of manufacturing an LED package according to the third embodiment of the invention.
Figure 14B:
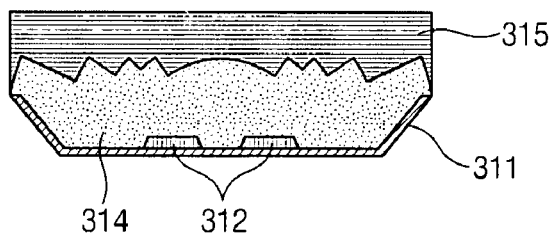

Referring to FIGS. 7, 14A, and 14B, a method of manufacturing an LED package according to the third embodiment of the invention will be described.

FIGS. 14A and 14B are diagrams for explaining the method of manufacturing an LED package according to the third embodiment of the invention.

As shown in FIG. 7, the method of manufacturing an LED package according to the third embodiment includes a preparing step, a dispensing step, an imprinting step, a solidifying step, and a separating step.

The preparing step is where one or more LED chips 312 are mounted in the concave portion of the frame 311. The dispensing step is where resin 314 is dispensed into the concave portion. The imprinting step is where a stamp 315 is imprinted on the upper surface of the resin 314 dispensed into the concave portion so as to carve the stamp, as shown in FIG. 14A. The solidifying step is where the resin 314 is solidified in a state where the stamp 315 is carved, as shown in FIG. 14B. The separating step is where the stamp 315 is separated to thereby complete the manufacturing of the LED package.

In the method of manufacturing an LED package according to the third embodiment of the invention, the upper surface shape of the flat dome lens 314 is engraved on the bottom surface of the stamp 315, instead of the Fresnel lens surface 215a.

Therefore, when the stamp 315 having the upper surface shape of the flat dome lens 314 engraved thereon is imprinted on the resin 314, the resin 314 has the flat dome lens 314 formed thereon.

Preferably, a release agent for promoting separation is provided between the resin 314 and the stamp 315.

That is, the release agent, which contains oil such that the stamp 315 is easily separated from the resin 314, is added into the resin 314 or applied on the engraved portion of the stamp 315.

The resin 314 may be formed of a transparent material such as epoxy, rubber, or silicon-based resin such that light can be transmitted.

Figure 15:
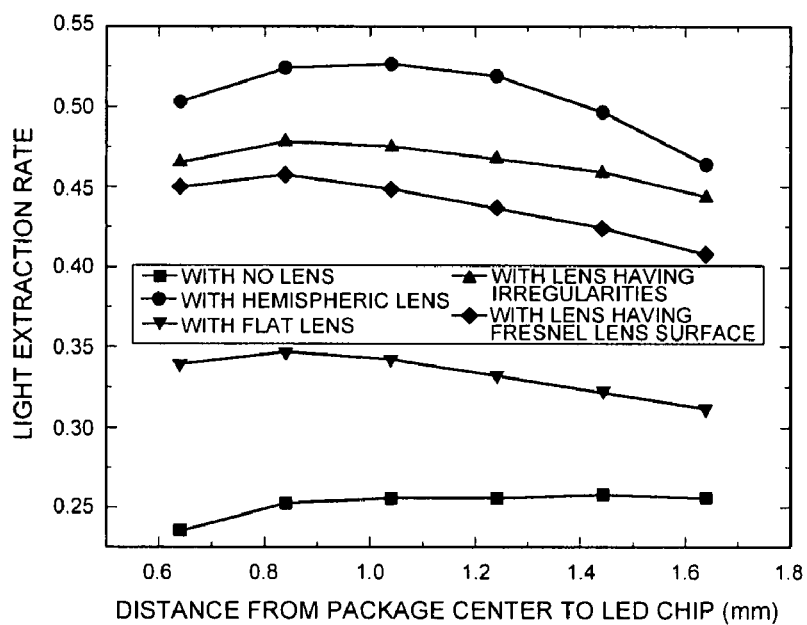
FIG. 15 is a graph comparatively showing light extraction rates of the LED packages according to the invention and the conventional LED packages.

FIG. 15 is a graph comparatively showing light extraction rates of the LED packages according to the invention and the conventional LED packages. As shown in FIG. 15, it can be found that the LED package with a lens having concentrically continuous prismatic irregularities formed thereon and the LED package with a lens having a Fresnel lens surface formed thereon have an excellent light extraction rate approximate to that of the LED package with a hemispheric lens, while having a thickness similar to that of the LED package with a flat lens.

Further, in the LED package with the Fresnel lens surface formed thereon, a distance from the center of the package to the LED chip is similar to that of the LED package with a flat lens. In the LED package with the lens having prismatic irregularities formed thereon, light extraction dependency according to a distance from the center of the package to the LED chip is reduced than the LED package with a hemispheric lens.

In addition, the LED package with a flat dome lens according to the third embodiment has a thickness similar to that of the LED package with a flat lens, while having the same light extraction rate as the LED package with an ideal hemispheric lens.

As described above, the LED package according to the invention can have an ultra-slim structure and obtain a high light extraction rate.

Further, the LED package according to the invention is simply manufactured so that a manufacturing time and a manufacturing cost can be reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An LED package, comprising:
   a frame having a concave portion formed in a center thereof;
   one or more LED chips mounted on a bottom surface of the concave portion; and
   a flat dome lens filled in the concave portion,
   wherein a vertical section of the flat dome lens comprises a plurality of arcs formed between a plurality of angle dividing lines that pass through a center point of an imagined circle, the center point thereof being positioned on an underside surface of the flat dome lens that contacts the bottom surface of the concave portion,
   each of the arcs has a respective radius that is equal to a distance along a particular one of the angle dividing lines that defines each arc, from the center point of the imagined circle to a point at which the particular angle dividing line intersects with a single straight line indicating a height of the flat dome lens,
   each of the arcs is positioned in contact with and under the single straight line indicating the height of the flat dome lens,
   a line defining a boundary between each pair of adjacent ones of the arcs is convergent with a corresponding angle dividing line that defines each pair of adjacent arcs, with respect to the center point of the circle,
   respective angle dividing lines are divided from one another by a predetermined angle, and
   distances between the points at which the straight line indicating the height of the flat dome lens and each of the angle dividing lines meet increase in a circumferential direction.

2. The LED package according to claim 1, wherein a side of the concave portion has a tapered shape expanding upward.

3. The LED package according to claim 1, wherein the frame has an upper opening having a circular shape, and a lower circumference of the lens has a shape corresponding to the shape of the upper opening of the frame.

4. The LED package according to claim 1, wherein the lens is formed of a transparent resin material.

* * * * *